United States Patent
Furusawa

(10) Patent No.: US 11,825,612 B2
(45) Date of Patent: Nov. 21, 2023

(54) FLUX, SOLDER PASTE, AND METHOD FOR PRODUCING ELECTRIC CIRCUIT BOARD

(71) Applicant: KOKI Company Limited, Tokyo (JP)

(72) Inventor: Mitsuyasu Furusawa, Tokyo (JP)

(73) Assignee: KOKI Company Limited, Tokyo (JP)

( * ) Notice: Subject to any disclaimer, the term of this patent is extended or adjusted under 35 U.S.C. 154(b) by 152 days.

(21) Appl. No.: 16/615,551

(22) PCT Filed: Oct. 2, 2017

(86) PCT No.: PCT/JP2017/035800
§ 371 (c)(1),
(2) Date: Nov. 21, 2019

(87) PCT Pub. No.: WO2019/043959
PCT Pub. Date: Mar. 7, 2019

(65) Prior Publication Data
US 2020/0187363 A1  Jun. 11, 2020

(30) Foreign Application Priority Data
Aug. 28, 2017 (JP) ................... 2017-163558

(51) Int. Cl.
B23K 35/365 (2006.01)
H05K 3/34 (2006.01)
B23K 35/36 (2006.01)

(52) U.S. Cl.
CPC ......... *H05K 3/3485* (2020.08); *B23K 35/365* (2013.01); *B23K 35/3618* (2013.01)

(58) Field of Classification Search
CPC ............................ H05K 3/3485; B23K 35/365
See application file for complete search history.

(56) References Cited

U.S. PATENT DOCUMENTS

| | | | |
|---|---|---|---|
| 5,919,317 A | 7/1999 | Tanahashi et al. | |
| 6,142,363 A | 11/2000 | Tanahashi et al. | |
| 2004/0000355 A1 | 1/2004 | Suga et al. | |
| 2008/0000549 A1 | 1/2008 | Sheng et al. | |
| 2008/0073000 A1 | 3/2008 | Ikeda et al. | |
| 2010/0243717 A1* | 9/2010 | Ishikawa | B23K 35/3613 148/23 |
| 2015/0027589 A1 | 1/2015 | Okada et al. | |

FOREIGN PATENT DOCUMENTS

| | | |
|---|---|---|
| CN | 101484271 | 7/2009 |
| CN | 104416297 | 3/2015 |
| JP | 06-087090 | 3/1994 |
| JP | 06087090 A * | 3/1994 |
| JP | 09-094691 | 4/1997 |
| JP | 2004-025305 | 1/2004 |
| JP | 2006-289497 | 10/2006 |
| JP | 2008-100279 | 5/2008 |
| JP | 2009-542019 | 11/2009 |
| JP | 2013-071152 | 4/2013 |
| JP | 2013-132654 | 7/2013 |
| JP | 2017-192987 | 10/2017 |
| WO | 2009/069601 | 6/2009 |

OTHER PUBLICATIONS

G. Dickman et al., "Overview of Natural Fat Technologies in Industrial Oil Chemistry", China Light Industry Press, Sep. 1995, p. 102. (concise explanation in the attached Chinese office action translation).

Junsei Chemical Co. Ltd., Material Safety Data Sheet, 1 / 6-6/6 page, amendment date: Aug. 19, 2013, print date: Nov. 26, 2018, URL: http://junsei.ehost.ip/productsearch/msds/17260jis.pdf#search+%27%E3%82%AA%E3%82%AF%E3%82%BF%E3%83%B3%E3%82%B8%E3%82%AA%E3%83%BC%E3%83%AB%27 , cited in the Japanese Opposition.

National Institute of Technology and Evaiuation, "GHS Classification Result by the Heisei 22(2010) Ministry of Health, Labour and Welfare and the Ministry of Environment", print date: Nov. 26, 2018, URL: http://www.safe.nite.go.jp/ghs/h22_mhlw_list.html , cited in the Japanese Opposition.

"Safe Datasheet", amendment date: Mar. 30, 2012, print date: Nov. 26, 2018, URL: https://anzeninfo.mhlw.gojp/anzen/gmsds/94-96-2.html , cited in the Japanese Opposition.

"Chemical Book", print date: Nov. 26, 2018, URL: http://www.chemicalbook.com/ChemicalProcuctProperty_JP_CB6193771.htm , cited in the Japanese Opposition.

* cited by examiner

Primary Examiner — Jophy S. Koshy
(74) Attorney, Agent, or Firm — Clark & Brody LP

(57) ABSTRACT

A flux includes: at least one liquid solvent that has one or more hydroxy groups and is liquid at ordinary temperature; and at least two solid solvents that respectively have one or more hydroxy groups and are solid at normal temperature, in which the content of each of the solid solvents is less than 40 mass % based on the total content of the liquid solvent and the solid solvents.

18 Claims, No Drawings

FLUX, SOLDER PASTE, AND METHOD FOR PRODUCING ELECTRIC CIRCUIT BOARD

CROSS-REFERENCE TO RELATED APPLICATION

This application claims priority to Japanese Patent Application No. 2017-163558, the disclosure of which is incorporated herein by reference in its entirety.

FIELD

The present invention relates to a flux used for soldering, a solder paste including the flux, and a method for producing an electric circuit board using the flux.

BACKGROUND

Solder paste in which solder alloy powder and flux are mixed together, for example, is used to join electronic parts to an electric circuit board such as a printed wiring board. As the flux, a resin-based flux including a natural resin such as rosin, a thixotropic agent, a solvent, an activator or the like is widely used.

In recent years, reported as a solvent has been a flux in which a solid solvent and a highly viscous solvent are used in combination with a commonly used liquid solvent (for example, Patent Literature 1). The flux can improve its viscosity by dissolving a solid solvent in a liquid solvent instead of including rosin. As a result, a solder paste having excellent printability can be obtained using the flux.

CITATION LIST

Patent Literature

Patent Literature 1: JP 2004-25305 A

SUMMARY

Technical Problem

In the aforementioned flux, when the content of the solid solvent dissolved in the liquid solvent increases, the solid solvent is crystallized and precipitated during storage under refrigeration. Therefore, there is a problem that use of the solder paste including such a flux causes a missing portion at the time of printing.

The present invention has been conceived to solve such a problem, and it is an object of the present invention to provide a flux having high viscosity and capable of suppressing crystallization, a solder paste, and a method for producing an electric circuit board.

Solution to Problem

A flux according to the present invention includes: at least one liquid solvent that has one or more hydroxy groups and is liquid at normal temperature; and at least two solid solvents that respectively have one or more hydroxy groups and are solid at normal temperature, in which the content of each of the solid solvents is less than 40 mass % based on the total content of the liquid solvent and the solid solvents.

In the flux according to the present invention, it is preferable that the contents Xi and Xj of any two of the solid solvents i and j among the solid solvents based on the total content of the liquid solvent and the solid solvents satisfy formula (1) below:

$$Xi < 0.2121 \times Xj + 31.818 \quad (1)$$

In the flux according to the present invention, it is preferable that the liquid solvent be at least one selected from 2-ethyl-1,3-hexanediol, α-terpineol, and isooctadecanol.

In the flux according to the present invention, it is preferable that the solid solvents be at least two selected from trimethylolpropane, 2,2-dimethyl-1,3-propanediol, 2,5-dimethyl-2,5-hexanediol, and 2-butyl-2-ethyl-1,3-propanediol.

In the flux according to the present invention, it is preferable that the total content of the solid solvents be 30 mass % or more and less than 80 mass % based on the total content of the liquid solvent and the solid solvents.

A solder paste according to the present invention includes the flux according to the present invention and solder alloy powder.

In the solder paste according to the present invention, it is preferable that the flux further include a fatty acid amide as a thixotropic agent.

In the solder paste according to the present invention, it is preferable that the fatty acid amide be at least one selected from stearic acid amide, lauric acid amide, palmitic acid amide, oleic acid amide, erucic acid amide, behenic acid amide, and hydroxystearic acid amide.

In the solder paste according to the present invention, it is preferable that the fatty acid amide be at least one selected from stearic acid amide and lauric acid amide.

In a method for producing an electric circuit board according to the present invention, soldering is performed using the flux according to the present invention.

DESCRIPTION OF EMBODIMENTS

Hereinafter, a flux, a solder paste, and a method for producing an electric circuit board according to an embodiment of the present invention will be described.

<Flux>

The flux according to this embodiment is a flux for soldering including: at least one liquid solvent that has one or more hydroxy groups and is liquid at normal temperature; and at least two solid solvents that respectively have one or more hydroxy groups and are solid at normal temperature, in which the content of each of the solid solvents is less than 40 mass % based on the total content of the liquid solvent and the solid solvents.

The liquid solvent has one or more hydroxy groups (OH groups) and is liquid at normal temperature (20 to 30° C.). Examples of such a liquid solvent include 2-ethyl-1,3-hexanediol, 2-methylpentane-2,4-diol, α-terpineol, isooctadecanol, and tetraethylene glycol. Among these, at least one selected from 2-ethyl-1,3-hexanediol, α-terpineol, and isooctadecanol is preferable in terms of suppressing crystallization of the solid solvents. These may be individually used, or two or more of them may be used in combination.

The content of the liquid solvent is preferably 10 to 90 mass % based on the entire flux in terms of suppressing separation between flux and solder powder. In the case where two or more liquid solvents are included, the content means the total content of the two or more liquid solvents.

Each of the solid solvents has one or more hydroxy groups (OH groups) and is solid at normal temperature (20 to 30° C.). Examples of such a solid solvent include trimethylolpropane, 2,2-dimethyl-1,3-propanediol, 2,5-dimethyl-2,5-hexanediol, 2-butyl-2-ethyl-1,3-propanediol, and 2,2,4-trimethyl-1,3-pentanediol. Among these, at least two selected from trimethylolpropane, 2,2-dimethyl-1,3-propanediol, 2,5-dimethyl-2,5-hexanediol, and 2-butyl-2-ethyl-1,3-propanediol are preferable in terms of suppressing crystallization of the solid solvents. Three or more of these may be used in combination.

The content of each of the at least two solid solvents is preferably less than 40 mass % and 2 mass % or more based on the total content of the liquid solvent and the solid solvents. The content of each of the solid solvents is preferably 10 mass % or more based on the total content of the liquid solvent and the solid solvents.

In terms of suppressing crystallization of the solid solvents, it is preferable that contents $Xi$ (mass %) and $Xj$ (mass %) of any two solid solvents i and j among the solid solvents based on the total content of the liquid solvent and the solid solvents satisfy formula (1) below. This means that the formula (1) below is satisfied regardless of which of the solid solvents is served as i or j of the any two solid solvents. In the case where three or more solid solvents are included, it means that the formula (1) below is satisfied regardless of which solid solvents are selected as the any two solid solvents among the solid solvents.

$$Xi < 0.2121 \times Xj + 31.818 \tag{1}$$

In terms of suppressing crystallization of the solid solvents, the total content of the solid solvents is preferably 30 mass % or more and less than 80 mass %, more preferably 45 mass % or more, further preferably 65 mass % or less based on the total content of the liquid solvent and the solid solvents. The total content of the solid solvents is preferably 35 to 60 mass % based on the entire flux, in terms of facilitating gelation with a thixotropic agent, which will be described later.

In the flux according to this embodiment, the at least two solid solvents are dissolved in the liquid solvent to be able to improve their solubility. Therefore, crystallization of the solid solvents can be suppressed by setting the content of each of the solid solvents to less than 40 mass % based on the total content of the liquid solvent and the solid solvents. In addition, the use of the at least two solid solvents broadens the range of solid solvents available for choice and facilitates designing a flux having high viscosity.

In the flux according to this embodiment, it is preferable that the contents $Xi$ and $Xj$ of any two of the solid solvents i and j among the solid solvents based on the total contents of the liquid solvent and the solid solvents satisfy the formula (1) above. Such a configuration allows crystallization of the solid solvents to be more suppressed.

In the flux according to this embodiment, the liquid solvent is preferably at least one selected from 2-ethyl-1,3-hexanediol, α-terpineol, and isooctadecanol. Such a configuration allows the solubility of the solid solvents to be improved, and consequently allows crystallization of the solid solvents to be more suppressed.

In the flux according to this embodiment, the solid solvents are preferably at least two selected from trimethylolpropane, 2,2-dimethyl-1,3-propanediol, 2,5-dimethyl-2,5-hexanediol, and 2-butyl-2-ethyl-1,3-propanediol. Such a configuration allows the solubility of the solid solvents to be improved, and consequently allows crystallization of the solid solvents to be more suppressed.

In the flux according to this embodiment, the total content of the solid solvents is preferably 30 mass % or more and less than 80 mass based on the total content of the liquid solvent and the solid solvents. Such a configuration allows crystallization of the solid solvents to be more suppressed.

The flux according to this embodiment may include, for example, an activator, a thixotropic agent, an antioxidant, a surfactant, a defoamer, and a corrosion inhibitor, as other additives.

Examples of the activator include an organic acid-based activator, an amine compound-based activator, and a halogen compound-based activator. Among these, an organic acid-based activator is preferable in terms of reducing the environmental load.

The organic acid-based activator is not particularly limited, and examples thereof include: a monocarboxylic acid such as formic acid, acetic acid, propionic acid, butyric acid, valeric acid, caproic acid, enanthic acid, capric acid, lauric acid, myristic acid, pentadecyl acid, palmitic acid, margaric acid, stearic acid, tuberculostearic acid, arachidic acid, behenic acid, lignoceric acid, and glycolic acid; a dicarboxylic acid such as oxalic acid, malonic acid, succinic acid, glutaric acid, adipic acid, pimeric acid, suberic acid, azelaic acid, sebacic acid, fumaric acid, maleic acid, tartaric acid, and diglycolic acid; and other organic acids such as dimer acid, levulinic acid, lactic acid, acrylic acid, benzoic acid, salicylic acid, anisic acid, citric acid, and picolinic acid. These may be individually used, or two or more of them may be used in combination.

The content of the organic acid-based activator is not particularly limited, but, for example, is preferably 0.1 mass % or more, more preferably 0.3 mass % or more based on the entire flux. The content is preferably 10 mass % or less, more preferably 7 mass % or less. In the case where two or more organic acid-based activators are included, the content means the total content of the organic acid-based activators.

The thixotropic agent is not particularly limited, and examples thereof include a fatty acid amide, castor oil, and hydrogenated castor oil. Among these, a fatty acid amide is preferable. Examples of the fatty acid amide include stearic acid amide, lauric acid amide, palmitic acid amide, oleic acid amide, erucic acid amide, behenic acid amide, hydroxystearic acid amide, and myristic acid amide. These may be individually used, or two or more of them may be used in combination.

The content of the thixotropic agent is preferably 1 mass % or more, more preferably 2 mass % or more, still more preferably 3 mass % or more based on the entire flux, in order to obtain good thixotropy. The content of the thixotropic agent is preferably 20 mass % or less, more preferably 15 mass % or less, and still more preferably 10 mass % or less based on the entire flux, in order to reduce flux residues. In the case where two or more thixotropic agents are included, the content means the total content of the thixotropic agents.

It is preferable that the flux according to this embodiment do not include a highly viscous solvent as a solvent. The highly viscous solvent herein has a viscosity of 10,000 cps or more at 30° C. and is liquid at normal temperature. Examples of such a highly viscous solvent include isobornylcyclohexanol. The flux according to this embodiment, which has sufficient viscosity, is not necessarily required to include a highly viscous solvent as a solvent. The highly viscous solvent has a high boiling point and is hardly volatilized during preheating at the time of soldering. Since the flux does not include a highly viscous solvent, the flux is suppressed from sagging, and solder balls and solder bridges are hardly generated.

<Solder Paste>

The solder paste according to this embodiment includes the flux according to this embodiment and solder alloy powder.

In the solder paste, the flux preferably includes a fatty acid amide as a thixotropic agent in addition to the aforementioned liquid solvent and solid solvents. The fatty acid amide is preferably at least one selected from stearic acid amide, lauric acid amide, palmitic acid amide, oleic acid amide, erucic acid amide, behenic acid amide, and hydroxystearic acid amide, more preferably at least one selected from stearic acid amide and lauric acid amide.

A solder alloy in the solder alloy powder is not particularly limited, and examples thereof include a lead-free solder alloy and a lead solder alloy. In terms of reducing the environmental load, a lead-free solder alloy is preferable. Examples of the lead-free solder alloy include an alloy including tin, silver, copper, indium, zinc, bismuth, antimony, or the like. More specifically, the examples include alloys of Sn/Ag, Sn/Ag/Cu, Sn/Cu, Sn/Ag/Bi, Sn/Bi, Sn/Ag/Cu/Bi, Sn/Sb, Sn/Ag/Sb, Sn/Sb/Cu, Sn/Zn/Bi, Sn/Zn, Sn/Zn/Al, Sn/Ag/Bi/In, Sn/Ag/Cu/Bi/In/Sb, and In/Ag.

The content of the flux is preferably 5 to 20 mass % based on the entire solder paste. The content of the solder alloy powder is preferably 80 to 95 mass % based on the entire solder paste.

The solder paste according to this embodiment includes the flux according to this embodiment, and is thus excellent in printability.

In the solder paste according to this embodiment, it is preferable that the flux further include a fatty acid amide as a thixotropic agent. Such a configuration allows the flux to be more viscous. Thus, the solder paste is more excellent in printability.

In the solder paste according to this embodiment, the fatty acid amide is preferably at least one selected from stearic acid amide, lauric acid amide, palmitic acid amide, oleic acid amide, erucic acid amide, behenic acid amide, and hydroxystearic acid amide. Such a configuration allows the flux to be more viscous. Thus, the solder paste is more excellent in printability.

In the solder paste according to this embodiment, the fatty acid amide is preferably at least one selected from stearic acid amide and lauric acid amide. Such a configuration allows the flux to be more viscous. Thus, the solder paste is more excellent in printability.

The flux according to this embodiment may be used for the solder paste as aforementioned, or may be filled inside the solder alloy formed in a linear shape to form a resin flux-cored solder for use. Further, the flux may be used for soldering by a flow soldering method, or may be used as a tack flux for temporarily fixing parts.

<Method for Producing Electric Circuit Board>

In the method for producing an electric circuit board according to this embodiment, soldering is performed using the flux according to the present invention. More specifically, the flux according to this embodiment is first printed on a conductor portion of the surface of the electric circuit board to form a solder printed pattern, and electronic parts to be mounted on the solder printed pattern are placed thereon. Next, the electric circuit board on which the electronic parts are placed is preheated at 150° C. to 200° C. in an air atmosphere, followed by main heating. In the main heating, soldering is performed by increasing the temperature above the melting point of the solder. Finally, the board is cooled naturally or using a cooling device such as a cooler to mount the electronic parts, thereby producing the electric circuit board. The soldering may be performed in an inert atmosphere such as under nitrogen gas or in a reducing atmosphere such as under hydrogen and formic acid gas, in addition to in the air atmosphere.

In the method for producing an electric circuit board according to this embodiment, the electric circuit board can be suitably produced without causing a missing portion at the time of printing.

EXAMPLES

Hereinafter, examples of the present invention will be described. However, the present invention is not limited to the following examples.

[Flux]

<Production of Flux>

Raw materials in mixing amounts shown in Tables 1 and 2 were put into a heating container and heated to 120° C. to melt all the raw materials. Thereafter, they were cooled to room temperature to obtain uniformly dispersed fluxes of Examples 1 to 21 and Comparative Examples 1 to 22. Each mixing amount shown in Tables 1 and 2 is equal to the content of each component included in a flux.

TABLE 1

Table 1

| | | | Example | | | | | | | | | | | |
|---|---|---|---|---|---|---|---|---|---|---|---|---|---|---|
| | | | 1 | 2 | 3 | 4 | 5 | 6 | 7 | 8 | 9 | 10 | 11 |
| Content (weight %) | Liquid solvent | 2-ethyl-1,3-hexanediol | 50 | 50 | 50 | 40 | 30 | 30 | 30 | 40 | 40 | — | 57 |
| | | α-terpineol | — | — | — | — | — | — | — | — | — | 30 | — |
| | | Isooctadecanol | — | — | — | — | — | — | — | — | — | — | — |
| | Solid solvent | 2,2-dimethyl-1,3-propanediol | 35 | 25 | 15 | 30 | 35 | 31.5 | 38.5 | 36 | 24 | 35 | 34 |
| | | 2,5-dimethyl-2,5-hexanediol | 15 | 25 | 35 | 30 | 35 | 38.5 | 31.5 | 24 | 36 | 35 | — |
| | | 2-butyl-2-ethyl-1,3-propanediol | — | — | — | — | — | — | — | — | — | — | — |
| | | Trimethylolpropane | — | — | — | — | — | — | — | — | — | — | 9 |
| | Crystallization evaluation | | ○ | ○ | Δ | ○ | ○ | ○ | ○ | ○ | ○ | ○ | ○ |

TABLE 1-continued

Table 1

| | | | Example | | | | | | | | | |
|---|---|---|---|---|---|---|---|---|---|---|---|---|
| | | | 12 | 13 | 14 | 15 | 16 | 17 | 18 | 19 | 20 | 21 |
| Content (weight %) | Liquid solvent | 2-ethyl-1,3-hexanediol | 57 | 57 | 48 | 34 | 23 | 41 | 40 | 40 | — | 17 |
| | | α-terpineol | — | — | — | — | — | — | — | — | — | — |
| | | Isooctadecanol | — | — | — | — | — | — | — | — | 50 | 21 |
| | Solid solvent | 2,2-dimethyl-1,3-propanediol | 17 | — | 25 | 28 | 34 | 23 | — | 30 | 25 | 31 |
| | | 2,5-dimethyl-2,5-hexanediol | 17 | 34 | 25 | 28 | 34 | 23 | 30 | — | 25 | 31 |
| | | 2-butyl-2-ethyl-1,3-propanediol | — | — | — | — | — | — | 30 | 30 | — | — |
| | | Trimethylolpropane | 9 | 9 | 2 | 9 | 9 | 14 | — | — | — | — |
| Crystallization evaluation | | | ○ | Δ | ○ | ○ | ○ | ○ | ○ | ○ | ○ | ○ |

TABLE 2

Table 2

| | | | Comparative Example | | | | | | | | | | | |
|---|---|---|---|---|---|---|---|---|---|---|---|---|---|---|
| | | | 1 | 2 | 3 | 4 | 5 | 6 | 7 | 8 | 9 | 10 | 11 | 12 |
| Content (weight %) | Liquid solvent | 2-ethyl-1,3-hexanediol | 50 | 50 | 40 | 40 | 40 | 40 | 40 | 30 | 30 | 30 | 30 | 20 |
| | Solid solvent | 2,2-dimethyl-1,3-propanediol | 5 | — | 60 | 54 | 18 | 6 | — | 63 | 28 | 21 | 7 | 72 |
| | | 2,5-dimethyl-2,5-hexanediol | 45 | 50 | — | 6 | 42 | 54 | 60 | 7 | 42 | 49 | 63 | 8 |
| | | Trimethylolpropane | — | — | — | — | — | — | — | — | — | — | — | — |
| Crystallization evaluation | | | X | X | X | X | X | X | X | X | X | X | X | X |

| | | | Comparative Example | | | | | | | | | |
|---|---|---|---|---|---|---|---|---|---|---|---|---|
| | | | 13 | 14 | 15 | 16 | 17 | 18 | 19 | 20 | 21 | 22 |
| Content (weight %) | Liquid solvent | 2-ethyl-1,3-hexanediol | 20 | 20 | 20 | 20 | 20 | 10 | — | 45 | 34 | 34 |
| | Solid solvent | 2,2-dimethyl-1,3-propanediol | 56 | 40 | 32 | 24 | 36 | 45 | 50 | — | 57 | — |
| | | 2,5-dimethyl-2,5-hexanediol | 24 | 40 | 48 | 56 | 44 | 45 | 50 | 45 | — | 57 |
| | | Trimethylolpropane | — | — | — | — | — | — | — | 9 | 9 | 9 |
| Crystallization evaluation | | | X | X | X | X | X | X | X | X | X | X |

Details of each of the raw materials shown in Tables 1 and 2 are shown below.
(Liquid Solvent)
2-ethyl-1,3-hexanediol: manufactured by KH Neochem Co., Ltd.
α-terpineol: manufactured by Nippon Terpene Chemicals Inc.
Isooctadecanol: manufactured by Nissan Chemical Corporation
(Solid Solvent)
2,2-dimethyl-1,3-propanediol: manufactured by MITSUBISHI GAS CHEMICAL COMPANY, INC.
2,5-dimethyl-2,5-hexanediol: manufactured by Tokyo Chemical Industry Co., Ltd.
2-butyl-2-ethyl-1,3-propanediol: manufactured by Tokyo Chemical Industry Co., Ltd.
Trimethylolpropane: manufactured by MITSUBISHI GAS CHEMICAL COMPANY, INC.
<Crystallization Evaluation>
Each of the fluxes of Examples 1 to 21 and Comparative Examples 1 to 22 was stored at normal temperature and under refrigeration, to evaluate crystallization based on the following criteria. The storage at normal temperature was carried out at 20 to 30° C. for 72 hours, and the storage under refrigeration was carried out at 0 to 10° C. for 72 hours. The results are shown in Table 1.

○: Crystallization does not occur during storage at normal temperature or during storage under refrigeration.

Δ: Crystallization does not occur during storage at normal temperature, but occurs during storage under refrigeration.

x: Crystallization occurs both during storage at normal temperature and during storage under refrigeration.

As shown in Tables 1 and 2, crystallization did not occur during storage under refrigeration in the fluxes of Examples 1 to 21 that satisfy all the composition requirements of the present invention. Further, crystallization did not occur during storage at normal temperature or storage under refrigeration in the fluxes of Examples 1, 2, 4 to 12, and 14 to 21.

[Solder Paste]
<Production of Flux>
Raw materials in mixing amounts shown in Table 3 were put into a heating container and heated to 120° C. to melt all the raw materials. Thereafter, they were cooled to room temperature to obtain uniformly dispersed fluxes of Examples 22 and 23 and Comparative Examples 23 and 24. Each mixing amount shown in Table 3 is equal to the content of each component included in a flux.

TABLE 3

| | | | | Example | | C. Example | |
|---|---|---|---|---|---|---|---|
| | | | | 22 | 23 | 23 | 24 |
| Flux composition | Content (weight %) | Liquid solvent | 2-ethyl-1,3-hexanediol | 44 | 20 | 44 | 44 |
| | | | Isooctadecanol | — | 24 | — | — |
| | | Solid solvent | 2,2-dimethyl-1,3-propenediol | 22 | 22 | — | 44 |
| | | | 2,5-dimethyl-2,5-hexanediol | 22 | 22 | 44 | — |
| | | Thixotropic agent | Stearic acid amide | 6 | 6 | 6 | 6 |
| | | | Lauric acid amide | 6 | 6 | 6 | 6 |
| Solder paste evaluation | | | Printing test | ○ | ○ | X | X |
| | | | Tackiness test | ○ | ○ | X | X |

Details of each of the raw materials shown in Table 3 are shown below.
(Liquid Solvent)
2-ethyl-1,3-hexanediol: manufactured by KH Neochem Co., Ltd.
Isooctadecanol: manufactured by Nissan Chemical Corporation
(Solid Solvent)
2,2-dimethyl-1,3-propanediol manufactured by MITSUBISHI GAS CHEMICAL COMPANY INC.
2,5-dimethyl-2,5-hexanediol manufactured by Tokyo Chemical Industry Co., Ltd.
(Thixotropic Agent)
Stearic acid amide: manufactured by Kao Corporation
Lauric acid amide: manufactured by Nihon Kasei CO., LTD.
<Production of Solder Paste>

Next, solder pastes were produced using the respective fluxes of Examples 22 and 23 and Comparative Examples 23 and 24. Specifically, each solder paste was produced by mixing 9 mass % of each flux and 91 mass % of solder alloy powder based on the entire solder paste. As the solder alloy powder, Sn-3.0Ag-0.5Cu (particle size: 20 μm to 45 μm, manufactured by KOKI Company Ltd.) was used.
<Printing Test>

Each of the obtained solder paste was printed using a solder paste printing machine (YVP-Xg manufactured by Yamaha Corporation). The solder paste was applied to a stencil mask having a dimension of 30 mm×30 mm and a thickness of 300 μm with openings formed therein, and was printed using a metal squeegee at 60 degrees. The printing speed was 20 mm/s, and the squeegee pressure was 55 N. A copper clad laminate was arranged on the back of the stencil mask so that the solder paste was transferred thereon corresponding to the pattern of the openings. The evaluation of the printing test was performed based on the following criteria. The results are shown in Table 3.
○: The printed shapes are the same as those of the openings of the stencil mask.
x: The printed shapes are smaller than those of the openings of the stencil mask, and part or all of them have a missing portion.
<Tackiness Test>

The tackiness test was carried out according to 315 Z 3284 (device: solder paste tackiness tester TK-1S, manufactured by Malcom Co., Ltd.). First, solder paste was printed on an alumina plate with a diameter of 6.5 mm and a thickness of 0.2 mm. Next, a stainless steel probe (with a diameter of 5.10 to 5.23 mm) was lowered onto the aforementioned printed pattern at a speed of 2.0 mm/s to apply pressure with a constant pressing force of 0.05±0.005 N, and pulled up at 10 mm/s within 0.2 seconds after the pressing. The maximum force required for pulling it away therefrom was recorded and evaluated based on the following criteria. The results are shown in Table 3. The test was carried out within 30 minutes after the printing.
○: The average of the measured values at N=5 was 70 gf or more.
x: The average of the measured values at N=5 was less than 70 gf, or no measured value could be detected.

As shown in Table 3, it was found that the solder pastes of Examples 22 and 23 that satisfy all the composition requirements of the present invention had high viscosity and excellent printability.

The invention claimed is:
1. A flux comprising:
at least one liquid solvent that has one or more hydroxy groups and is liquid at normal temperature;
at least two solid solvents that respectively have one or more hydroxy groups and are solid at normal temperature; and
a thixotropic agent;
wherein:
the normal temperature is a temperature of 20° C. to 30° C.;
the content of each of the solid solvents is 2 mass % or more and less than 40 mass % based on the total content of the liquid solvent and the solid solvents;
the total content of the solid solvents is 52 mass % or more and less than 80 mass % based on the total content of the liquid solvent and the solid solvents;
the thixotropic agent is a fatty acid amide, and the fatty acid amide is at least one selected from the group consisting of stearic acid amide, lauric acid amide, palmitic acid amide, oleic acid amide, erucic acid amide, behenic acid amide, and hydroxystearic acid amide.
2. The flux according to claim 1, wherein the contents Xi and Xj of any two of the solid solvents i and j among the solid solvents based on the total content of the liquid solvent and the solid solvents satisfy formula (1) below:

$$Xi < 0.2121 \times Xj + 31.818 \quad (1).$$

3. The flux according to claim 1, wherein the liquid solvent is at least one selected from 2-ethyl-1,3-hexanediol, a-terpineol, and isooctadecanol.
4. The flux according to claim 1, wherein the solid solvents are at least two selected from trimethylolpropane, 2,2-dimethyl-1,3-propanediol, 2,5-dimethyl-2,5-hexanediol, and 2-butyl-2-ethyl-1,3-propanediol.
5. The flux according to claim 1, further comprising at least one selected from an activator, an antioxidant, a surfactant, a defoamer, and a corrosion inhibitor.
6. A solder paste comprising: the flux according to claim 1; and solder alloy powder.
7. The solder paste according to claim 1, wherein the fatty acid amide is at least one selected from stearic acid amide and lauric acid amide.
8. The flux according to claim 2, wherein the liquid solvent is at least one selected from 2-ethyl-1,3-hexanediol, a-terpineol, and isooctadecanol.
9. The flux according to claim 2, wherein the solid solvents are at least two selected from trimethylolpropane, 2,2-dimethyl-1,3-propanediol, 2,5-dimethyl-2,5-hexanediol, and 2-butyl-2-ethyl-1,3-propanediol.

10. The flux according to claim 2, further comprising at least one selected from an activator, an antioxidant, a surfactant, a defoamer, and a corrosion inhibitor.

11. The flux according to claim 3, wherein the solid solvents are at least two selected from trimethylolpropane, 2,2-dimethyl-1,3-propanediol, 2,5-dimethyl-2,5-hexanediol, and 2-butyl-2-ethyl-1,3-propanediol.

12. The flux according to claim 3, further comprising at least one selected from an activator, an antioxidant, a surfactant, a defoamer, and a corrosion inhibitor.

13. The flux according to claim 4, further comprising at least one selected from an activator, an antioxidant, a surfactant, a defoamer, and a corrosion inhibitor.

14. The flux according to claim 8, wherein the solid solvents are at least two selected from trimethylolpropane, 2,2-dimethyl-1,3-propanediol, 2,5-dimethyl-2,5-hexanediol, and 2-butyl-2-ethyl-1,3-propanediol.

15. The flux according to claim 8, further comprising at least one selected from an activator, an antioxidant, a surfactant, a defoamer, and a corrosion inhibitor.

16. The flux according to claim 9, further comprising at least one selected from an activator, an antioxidant, a surfactant, a defoamer, and a corrosion inhibitor.

17. The flux according to claim 11, further comprising at least one selected from an activator, an antioxidant, a surfactant, a defoamer, and a corrosion inhibitor.

18. A method for producing an electric circuit board, comprising soldering using the flux according to claim 1.

* * * * *